United States Patent
Shi et al.

(10) Patent No.: US 9,178,511 B2
(45) Date of Patent: Nov. 3, 2015

(54) CAPACITIVE KEYPAD POSITION SENSOR WITH LOW CROSS-INTERFERENCE

(71) Applicants: Changchao Shi, Suzhou (CN); Yonggang Chen, Suzhou (CN); Dechang Wang, Suzhou (CN)

(72) Inventors: Changchao Shi, Suzhou (CN); Yonggang Chen, Suzhou (CN); Dechang Wang, Suzhou (CN)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 117 days.

(21) Appl. No.: 14/230,003

(22) Filed: Mar. 31, 2014

(65) Prior Publication Data
US 2014/0367239 A1    Dec. 18, 2014

(30) Foreign Application Priority Data
Jun. 17, 2013    (CN) .......................... 2013 1 0237859

(51) Int. Cl.
*H03K 17/96*    (2006.01)
(52) U.S. Cl.
CPC .... *H03K 17/9622* (2013.01); *H03K 2017/9613* (2013.01); *H03K 2217/960715* (2013.01); *H03K 2217/960755* (2013.01)
(58) Field of Classification Search
CPC ........... H03K 17/96; G06F 3/041; G09G 5/00
USPC .................................. 200/5 A, 600; 345/173
See application file for complete search history.

(56) References Cited

U.S. PATENT DOCUMENTS

| | | | |
|---|---|---|---|
| 5,463,388 A | 10/1995 | Boie | |
| 6,297,811 B1 | 10/2001 | Kent | |
| 7,098,897 B2 | 8/2006 | Vakil | |
| 2006/0097992 A1 | 5/2006 | Gitzinger | |
| 2007/0008299 A1 | 1/2007 | Hristov | |
| 2007/0132737 A1 | 6/2007 | Mulligan | |
| 2007/0273560 A1 | 11/2007 | Hua | |
| 2008/0136784 A1 | 6/2008 | Neoh | |
| 2008/0143679 A1 | 6/2008 | Harmon | |
| 2010/0245135 A1 | 9/2010 | Camacho | |

*Primary Examiner* — Edwin A. Leon
*Assistant Examiner* — Iman Malakooti
(74) *Attorney, Agent, or Firm* — Charles Bergere (57) ABSTRACT

A capacitive keypad position sensor includes a keypad touch panel having a first defined key area disposed in a plane having first and second orthogonal axes. First and second electrodes respectively occupy first and second areas below the first defined key area. Each electrode includes a plurality of parallel rows extending along the first axis and spaced apart from one another along the second axis. Each of the plurality of rows has a length along the first axis that is substantially equal to a width of the first defined key area along the first axis measured at a position along the second axis corresponding to the respective one of the plurality of rows. At least some of the first and second pluralities of rows are interleaved with one another.

14 Claims, 7 Drawing Sheets

CAPACITIVE KEYPAD POSITION SENSOR WITH LOW CROSS-INTERFERENCE

BACKGROUND OF THE INVENTION

The present invention is directed to capacitive touch sensors and, more particularly, to a capacitive keypad position sensor with multiplexed electrodes that reduces or eliminates interference among inaccurate touch inputs.

Touch panels have become prevalent in recent years, particularly in the field of mobile devices, such as cell phones, tablets, and the like. Touch panels may utilize capacitive detection to determine an input. That is, the touch panel includes an insulative material, such as glass, that is coated on one surface with one or more electrodes. A user's finger pressed upon the uncoated surface of the insulator forms a capacitor with an adjacent electrode, causing a disturbance in the electric field applied to the electrode that is detected and registered as the position on the panel touched by the user.

Often, such touch panels will include one or more defined key areas, which can represent alphanumeric or other data input. If there is a one-to-one correspondence between electrodes and defined key areas, as the number of defined key areas increases, the number of electrodes, and hence the number of inputs to a microcontroller or like processor also increases. This can increase complexity and cost for manufacturing the device.

One solution that has been developed is touch key multiplexing, which allows the number of electrodes to be less than the number of defined key areas on the touch panel. In the multiplexing configuration, each defined key area is assigned a unique combination of two electrodes such that the touch by a user of a defined key area alters the electric field of two electrodes simultaneously. The microcontroller determines the proper input based on the combination. Thus, electrodes can be used for multiple defined key areas and the number of electrodes required may be reduced.

Figure 1:
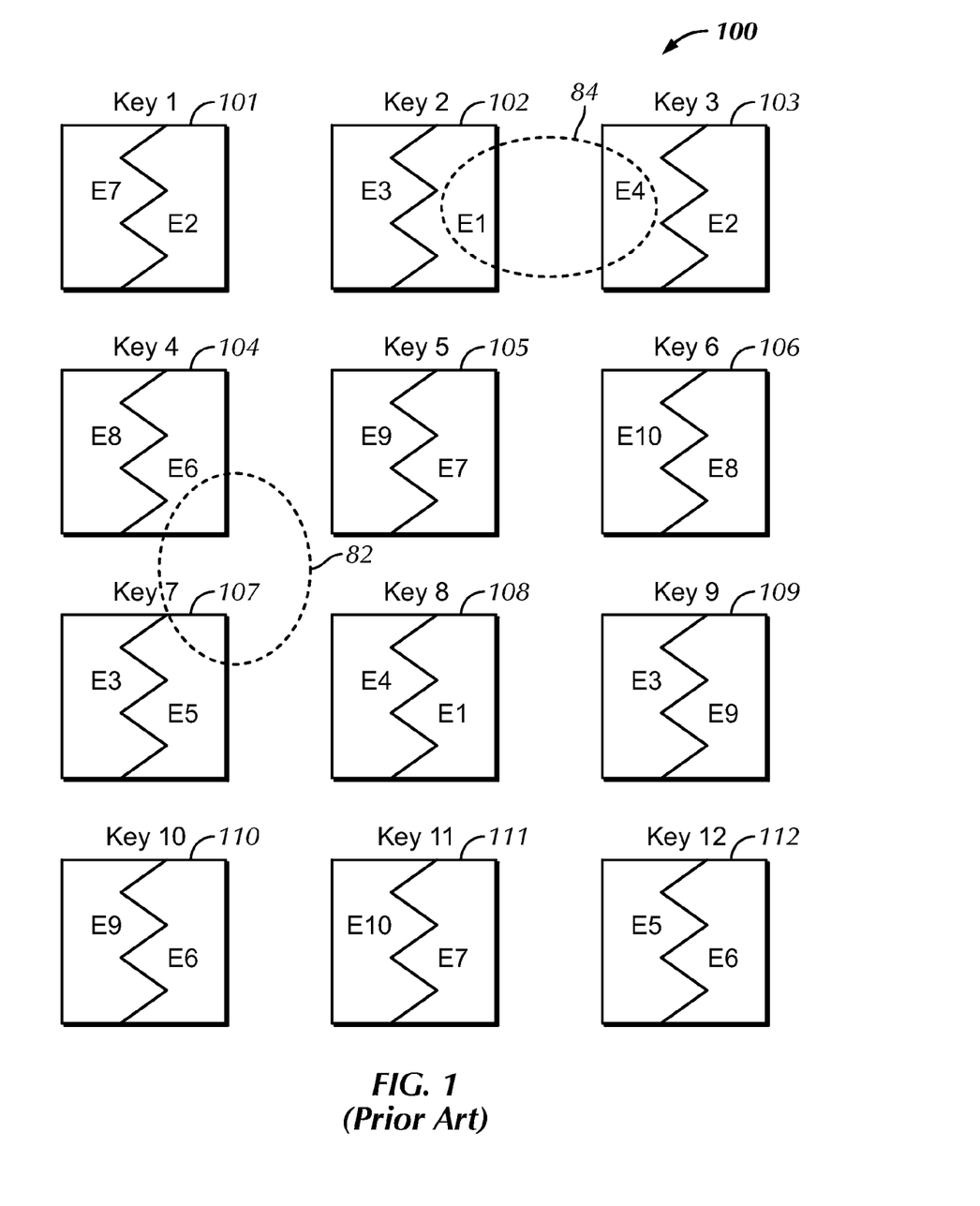
FIG. 1 is a schematic diagram of an array of defined key areas and the corresponding multiplexed electrodes in accordance with the prior art.

FIG. 1 shows an array 100 of defined key areas 101-112 that represent a sequence of twelve numbers key1-key12 selectable by a user. The array 100 further includes ten electrodes E1-E10. A unique combination of two of the electrodes is assigned to each of the defined key areas 101-112, with each electrode E1-E10 occupying about half of an area below the respective defined key area 101-112.

Unfortunately, this design has a drawback in that the user must touch near the center of the desired defined key area 101-112 in order to actuate the proper combination of electrodes E1-E10. If the user's finger lands too far to one side of the center of the desired defined key area 101-112, the microcontroller may not properly register the input. Worse, as shown in FIG. 1 by the errant touches 82, 84, a different defined key area 101-112 may be registered by the microcontroller than the desired input. This phenomenon is called cross-interference between keys.

For example, if the user's finger 82 lands between key4 104 and key7 107, the electrodes E5 and E6 would be actuated, and the microcontroller, based on the received input combination of electrodes E5 and E6 will register that key12 112 (having the combination of electrodes E5 and E6) was selected. Similarly, if the user's finger 84 lands between key2 102 and key3 103, the electrodes E1 and E4 are actuated, which the microcontroller will understand as selection of key8 108.

It is therefore desirable to provide a touch panel that reduces or eliminates the potential for cross-interference between adjacent keys when the user's touch is not precisely centered on the desired defined key area.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

In the drawings.

DETAILED DESCRIPTION OF THE INVENTION

Figure 2:
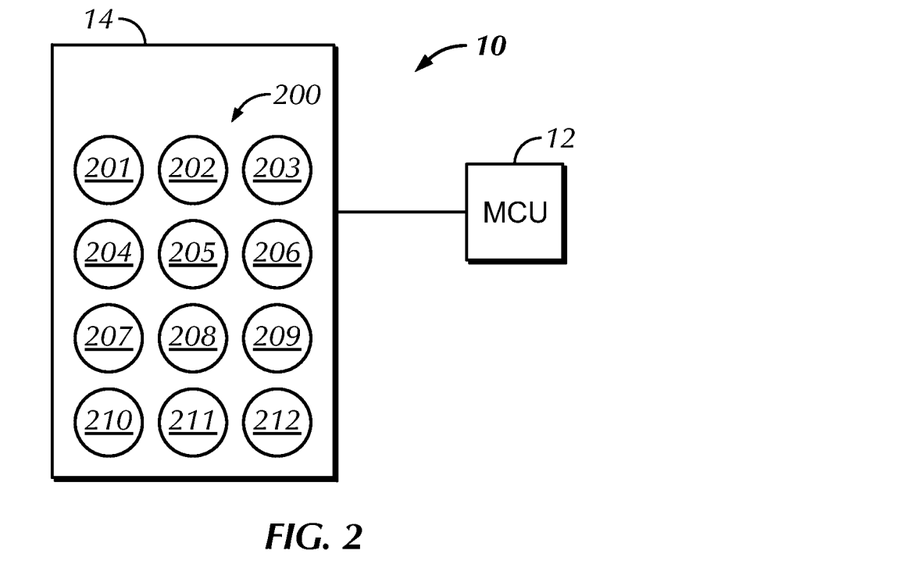
FIG. 2 is a schematic diagram of a device using a keypad position sensor according to a preferred embodiment of the present invention.

Referring to the drawings, wherein the same reference numerals are used to designate the same components throughout the several figures, there is shown in FIG. 2 a capacitive keypad position sensor 10 having a microcontroller unit (MCU) 12 and a keypad touch panel 14. As described above, the touch panel 14 is preferably an insulative material, such as glass, polymeric materials, or the like and includes an array 200 of a plurality of defined key areas 201-212. Each of the defined key areas 201-212 preferably is disposed in a plane having a first axis (e.g., hereinafter referred to as the "x-axis") and an orthogonal second axis (e.g., hereinafter referred to as the "y-axis").

In some embodiments, the touch panel 14 is part of a dynamic display that can visually provide a representation of the defined key areas 201-212 for selection. In such embodiments, the touch panel 14 may be positioned behind or in front of a display screen (not shown), such as a liquid crystal display or the like. Alternatively, the touch panel 14 can itself serve as the display screen. In other embodiments, the touch panel 14 may form part of a static panel, such as a fixed keypad or the like, wherein the touch panel 14 may include a coating or cover that provides a more permanent type of visual representation of the defined key areas 201-212 to the user.

Figure 3:
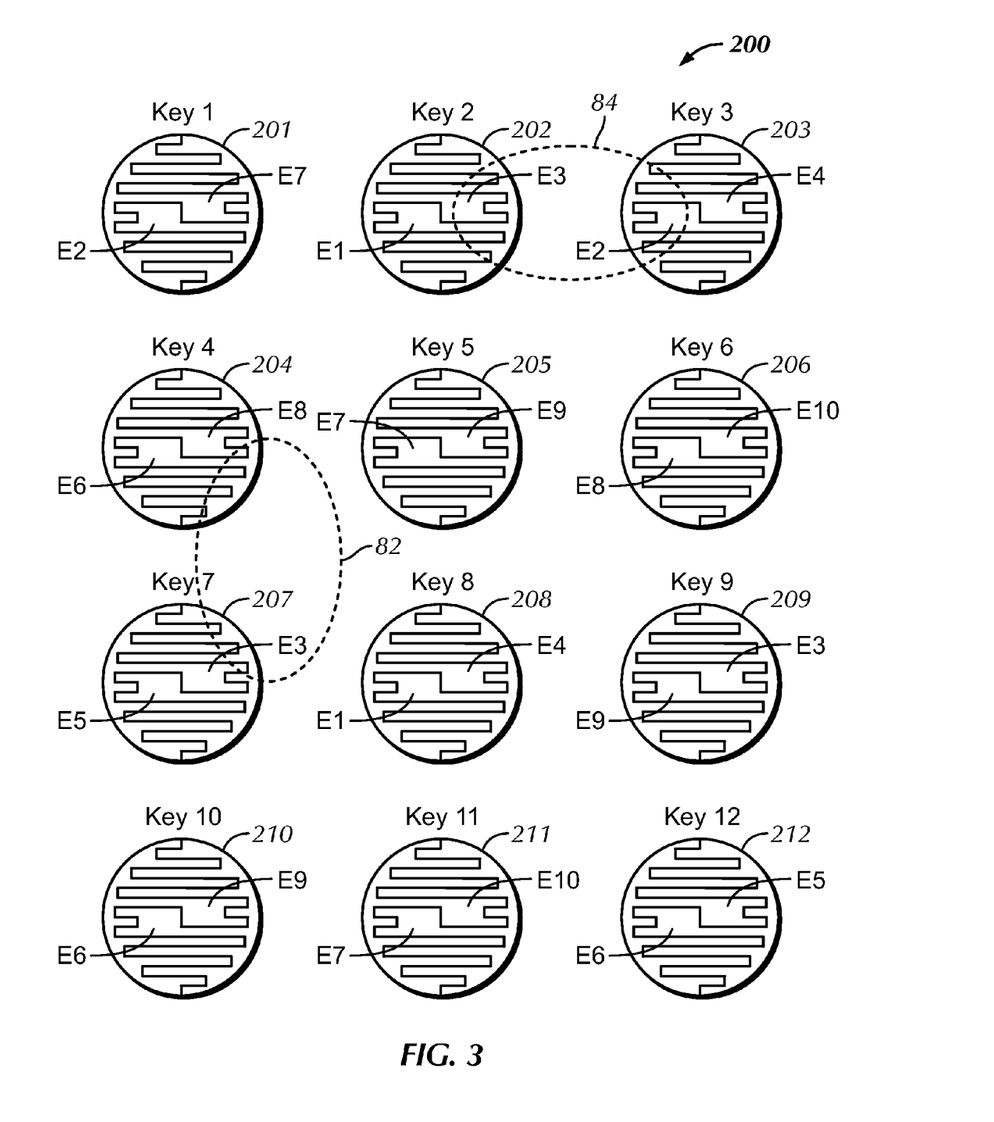
FIG. 3 is a schematic diagram of an array of defined key areas and the corresponding multiplexed electrodes in accordance with the preferred embodiment.

The defined key areas 201-212 are shown in FIGS. 2 and 3 as being generally circular, although other oval shapes, including ellipses, racetrack shapes, or the like may also be used. In addition, polygonal shapes, including but not limited to rectangles, triangles, pentagons, or the like, may also be used for the defined key areas 201-212. It is further preferred that each defined key area 201-212 be sized approximately identically to all of the other key areas 201-212, although variations among the individual defined key areas 201-212 are also contemplated.

The touch panel 14 is in electrical communication with the MCU 12 via electrodes E1-E10 (FIG. 3) that are preferably coated on a rear surface of the touch panel 14. The electrodes E1-E10 are preferably arranged to correspond with the defined key areas 201-212 as will be explained in detail below. The electrodes E1-E10 are preferably formed of a conductive coating material, such as indium tin oxide (ITO) or the like, which may also be transparent depending upon the desired application. The electrodes E1-E10 may be coupled to the MCU 12 via traces, wires, or other connectors (not shown).

Figure 4:
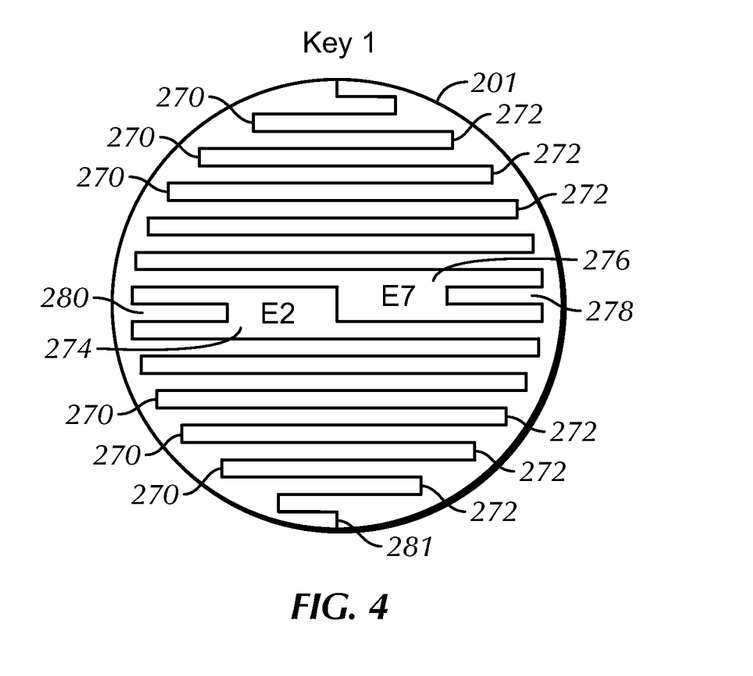
FIG. 4 is an enlarged top plan view of two electrodes disposed below a defined key area from the array in FIG. 3.

FIG. 4 is an enlarged view of electrodes E2, E7 positioned below key1 201 in accordance with a preferred embodiment of the invention. Electrode E2 occupies a first area below key1 201 and electrode E7 occupies a second area below key1 201. The first and second areas are preferably approximately equal in overall area.

Electrode E2 is shown to include a plurality of parallel rows 270, each of which extends along the x-axis, and which are spaced apart from one another along the y-axis. The rows 270 each have a height along the y-axis, and the heights of each of the rows 270 is preferably approximately equal. However, it is contemplated that the rows 270 may have differing heights.

Each of the rows 270 preferably also has a length measured along the x-axis that is substantially equal to a width of the defined key area key 201, which is also measured along the x-axis. If a defined key area 201-212 is in the shape of a square or some other shape where the width of the defined key area 201-212 is constant independent of position along the y-axis, then the rows 270 may each have the same length. However, in FIG. 4 the defined key area key1 201 is in the shape of a circle. Thus, each row 270 may have a different length. Thus, for any shape of the defined key area 201-212, the length of a particular row 270 is preferably substantially equal to a width of the defined key area 201-212 as measured at a position along the y-axis that corresponds to the respective row 270.

Electrode E7 is also shown to include a plurality of parallel rows 272, each of which extends along the x-axis, and which are spaced apart from one another along the y-axis. As with the electrode E2, the rows 272 of the electrode E7 each have a height along the y-axis which may be the same or different from the height of each of the other rows 272. Further, the length of a particular row 272 is preferably substantially equal to a width of the defined key area key1 201 as measured at a position along the y-axis that corresponds to the respective row 272. At least a portion, and preferably all of the rows 272 of the electrode E7 are preferably interleaved with the rows 270 of the electrode E2. The result is that the electrodes E2, E7 substantially overlap with one another over substantially the entire defined key area and form a pattern that increases the probability that a touch by the user at any location within the defined key area activates both electrodes E2, E7.

It is further preferred that the electrodes E2, E7 each respectively include a central region 274, 276 proximate a center of the defined key area key1 201. The central regions 274, 276 preferably have heights along the y-axis that are greater than the heights of the rows 270, 272 formed by the electrodes E2, E7. In addition, a length of each of the central regions 274, 276 of the electrodes E2, E7 is preferably less than half of the maximum width of the defined key area key1, 201 (e.g., the diameter of the circle in FIG. 4). The central regions 274, 276 are preferably adjacent to one another, although other orientations are possible. Each electrode E2, E7 may also include one or more short rows 278, 280 that extend partially into the central region 276, 274 of the opposing electrode E7, E2.

The electrodes E2, E7 are preferably divided into the first and second areas by insulating material 281, which may be silica, silicon nitride, polyimide, or the like. The insulating material 281 may also be simply a material of the touch panel 14 itself with the electrodes E2 E7 being separately applied to leave at least a small space therebetween.

Referring again to FIG. 3, the electrodes E1-E10 are multiplexed with the defined key areas 201-212 similar to the arrangement shown in FIG. 1, but each defined key area utilizes the electrode configuration shown in FIG. 4. With this configuration, if the user's finger 82 lands between key4 204 and key7 207, not only are electrodes E5 and E6 actuated, but electrodes E3 and E8 are also actuated and the microcontroller, is enabled to better determine the true position of the user's finger 82, and will not read an improper key input. Similarly, if the user's finger 84 lands between key2 202 and key3 203, the electrodes E1-E4 are all actuated, which allows the microcontroller to understand the user's finger as being placed between key2 202 and key3, 203.

Figure 5:
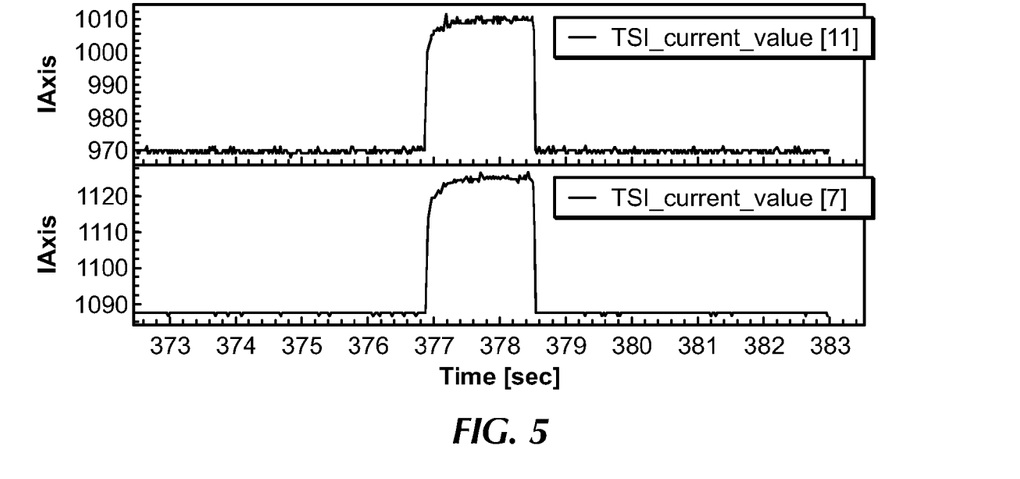
FIG. 5 is a plot of current level with respect to time for two electrodes when a user touches a center of the defined key area.
Figure 6:
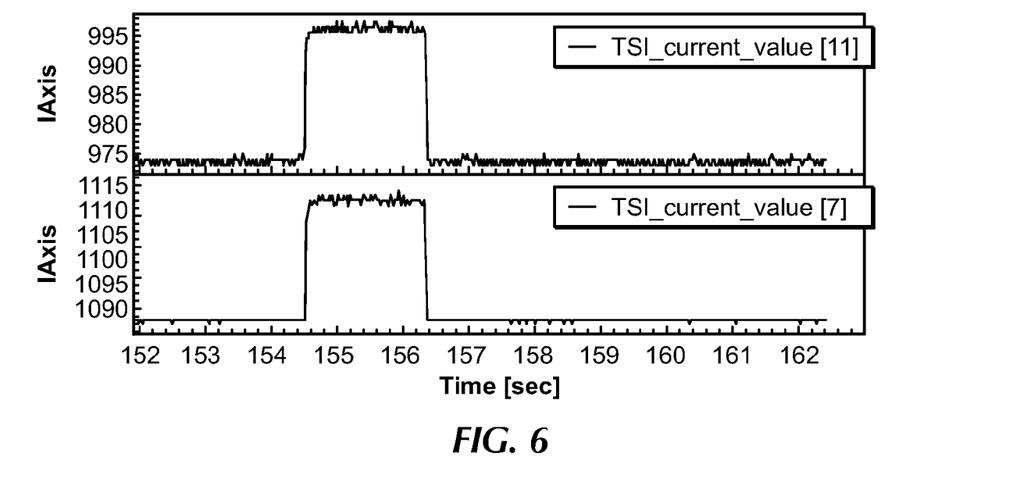
FIG. 6 is a plot of current level with respect to time for two electrodes when a user touches a left half of the defined key area.
Figure 7:
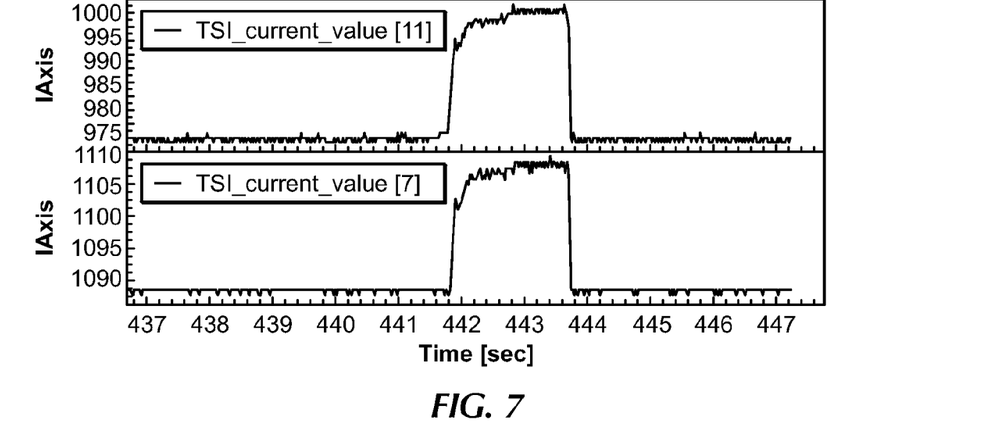
FIG. 7 is a plot of current level with respect to time for two electrodes when a user touches a right half of the defined key area.
Figure 8:
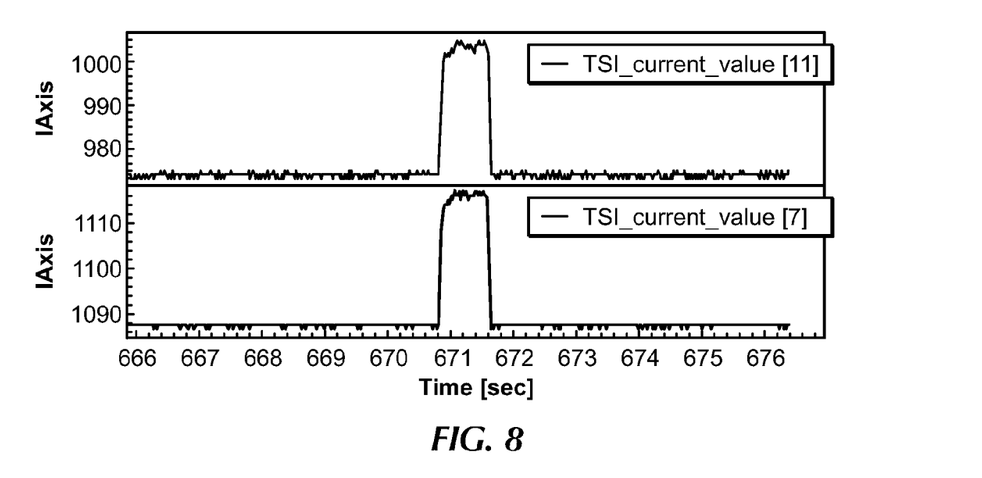
FIG. 8 is a plot of current level with respect to time for two electrodes when a user touches a top half of the defined key area.
Figure 9:
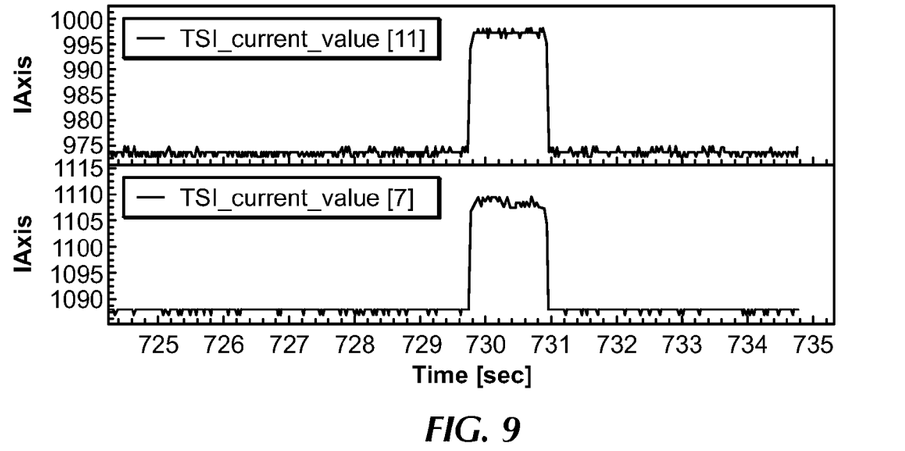
FIG. 9 is a plot of current level with respect to time for two electrodes when a user touches a bottom half of the defined key area.
Figure 10:
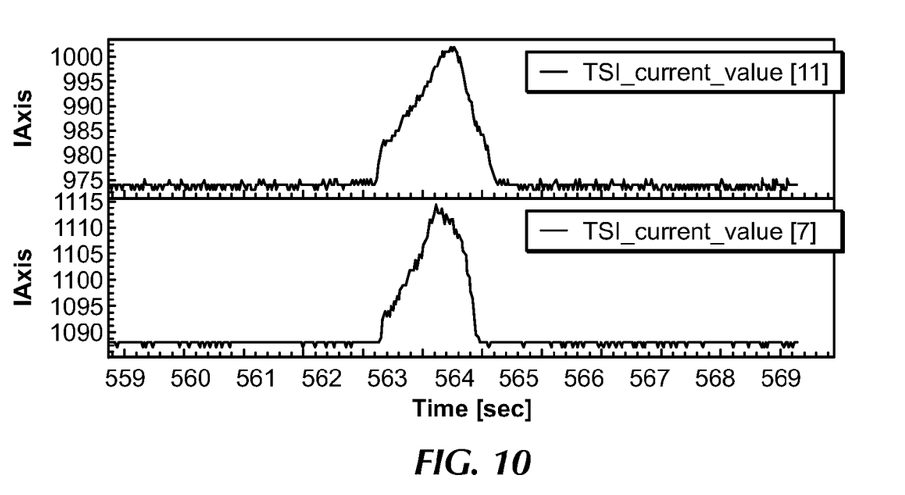
FIG. 10 is a plot of current level with respect to time for two electrodes when a user moves a finger from left to right on the defined key area.
Figure 11:
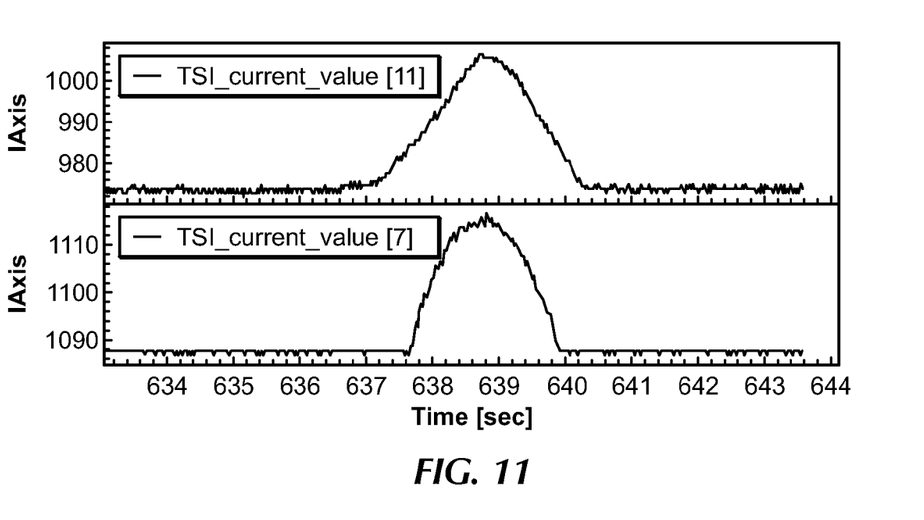
FIG. 11 is a plot of current level with respect to time for two electrodes when a user moves a finger from top to bottom on the defined key area.

FIGS. 5-11 show data measurements for two electrodes (titled TSI7, TSI11) configured as shown in FIG. 4 beneath a defined key area ("KEY"). The different charts represent different locations of the touch, as described below. In FIG. 5, the KEY was touched at a central point, which resulted in a change in measured current to both electrodes at substantially the same time. In FIGS. 6 and 7, the left and right halves of the KEY were touched, respectively. Again, in each instance, a current change was detected for both electrodes. Similarly, in FIGS. 8 and 9, the top and bottom halves of the KEY were touched, respectively, and current change was measured for both electrodes each time. In FIG. 10, the user's finger was moved from left to right over the KEY. Again, the detection of current change in both electrodes is nearly simultaneous. The slight differences in timing on the plot are attributable to the 10 mil trace width used in forming the electrodes. While 10 mil trace width is most cost effective, better results are found when using smaller trace width. However, as shown by the plots herein, even using a 10 mil trace width, results are substantially improved over the prior art and prove a very effective solution. FIG. 11 is similar to FIG. 10, with the exception that the user's finger was moved from top to bottom of the KEY.

In the foregoing specification, the invention has been described with reference to specific examples of an embodiment of the invention. It will, however, be evident that various modifications and changes may be made therein without departing from the broader spirit and scope of the invention as set forth in the appended claims.

Those skilled in the art will also recognize that the term "coupled" can mean direct or indirect coupling between elements for communication of data or other signals. For example, a component may be coupled to another through one or mode additional components such as switches, a BUS, or the like. Moreover, components may be combined into a single functional unit rather than being separate components connected by a wire, trace, or the like.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A capacitive keypad position sensor, comprising:
    a keypad touch panel having a first defined key area disposed in a plane having first and second orthogonal axes;
    a first electrode occupying a first area below the first defined key area, the first electrode including a first plurality of generally parallel rows extending along the first axis and spaced apart from one another along the second axis, each of the first plurality of rows having a length along the first axis that is substantially equal to a width of the first defined key area along the first axis measured at a position along the second axis corresponding to the respective one of the first plurality of rows; and
    a second electrode occupying a second area below the first defined key area, the second electrode including a second plurality of generally parallel rows extending along the first axis and spaced apart from one another along the second axis, each of the second plurality of rows having a length along the first axis that is substantially equal to a width of the first defined key area along the first axis measured at a position along the second axis corresponding to the respective one of the second plurality of rows,
    at least some of the first and second pluralities of rows being interleaved with one another.

2. The sensor of claim 1, wherein the first electrode has a first central region and the second electrode has a second central region, each of the first and second central regions having a length along the first axis that is less than about half of a maximum width of the defined key area along the first axis.

3. The sensor of claim 2, wherein the first and second central regions are disposed adjacent to one another proximate a center of the first defined key area.

4. The sensor of claim 1, wherein the first defined key area is one of an oval or a polygon.

5. The sensor of claim 1, wherein the first and second areas are approximately equal.

6. The sensor of claim 1, further comprising an insulating material that separates at least a portion of the first and second areas occupied by the first and second electrodes.

7. The sensor of claim 1, further comprising a second defined key area, wherein one of the first or second electrodes also occupies an area below the second defined key area.

8. A capacitive keypad position sensor, comprising:
    a keypad touch panel having a plurality of defined key areas, each disposed in a plane having first and second orthogonal axes; and
    a plurality of electrodes disposed below the plurality of defined key areas, the number of electrodes being less than the number of defined key areas, first and second areas below each of the defined key areas being respectively occupied by a unique combination of two of the electrodes, wherein:
        the electrode occupying the first area includes a first plurality of generally parallel rows extending along the first axis and spaced apart from one another along the second axis, each of the first plurality of rows having a length along the first axis that is substantially equal to a width of the respective defined key area along the first axis measured at a position along the second axis corresponding to the respective one of the first plurality of rows, and
        the electrode occupying the second area includes a second plurality of generally parallel rows extending along the first axis and spaced apart from one another along the second axis, each of the second plurality of rows having a length along the first axis that is substantially equal to a width of the respective defined key area along the first axis measured at a position along the second axis corresponding to the respective one of the second plurality of rows,
        at least some of the first and second pluralities of rows being interleaved with one another.

9. The sensor of claim 8, wherein the electrode occupying the first area has a first central region and the electrode occupying the second area has a second central region, each of the first and second central regions having a length along the first axis that is less than about half of a maximum width of the respective defined key area along the first axis.

10. The sensor of claim 9, wherein the first and second central regions are disposed adjacent to one another proximate a center of the respective defined key area.

11. The sensor of claim 8, wherein one or more of the electrodes is disposed below at least two of the defined key pads.

12. The sensor of claim 8, wherein each of the defined key areas is one of an oval or a polygon.

13. The sensor of claim 8, wherein the first and second areas are approximately equal.

14. The sensor of claim 8, further comprising an insulating material that separates at least a portion of the first and second areas under each defined key pad.

* * * * *